United States Patent
Lehmann et al.

[11] Patent Number: 5,908,706
[45] Date of Patent: Jun. 1, 1999

[54] DUMMY PLATE FOR OFFSET PRINTING

[75] Inventors: Peter Lehmann, Kelkheim; Klaus Joerg, Ingelheim, both of Germany

[73] Assignee: Agfa-Gervert, Mortsel, Belgium

[21] Appl. No.: 08/803,030

[22] Filed: Feb. 19, 1997

[30] Foreign Application Priority Data

Feb. 19, 1996 [EP] European Pat. Off. ............ 96200429

[51] Int. Cl.$^6$ .............. B32B 15/04; B05D 3/00; B41N 1/00

[52] U.S. Cl. .......... 428/469; 428/341; 428/457; 428/500; 428/523; 428/688; 428/913; 427/327; 427/379; 427/384; 427/402

[58] Field of Search ............ 428/219, 688, 428/411.1, 457, 461, 469, 470, 913, 340, 341, 500, 523; 427/154, 156, 299, 309, 327, 372.2, 379, 384, 402

[56] References Cited

U.S. PATENT DOCUMENTS

| | | | |
|---|---|---|---|
| 3,458,311 | 7/1969 | Alles | 96/35.1 |
| 5,143,813 | 9/1992 | Joerg | 430/162 |
| 5,326,674 | 7/1994 | Toyama et al. | 430/325 |

FOREIGN PATENT DOCUMENTS

| | | |
|---|---|---|
| 2051971 A1 | 3/1993 | Canada . |
| 0 407 081 | 1/1991 | European Pat. Off. . |
| 40 30 056 | 3/1992 | Germany . |

*Primary Examiner*—Marie Yamnitzky
*Attorney, Agent, or Firm*—Foley & Lardner

[57] ABSTRACT

A dummy plate for offset printing comprising essentially a mechanically and/or electrochemically roughened, anodically oxidized and hydrophilized aluminium support in the form of a plate, sheet or band and a non light-sensitive, water-soluble layer coated thereon, and characterized in that the layer contains at least one organic polymer with a water-solubility of at least 2 g/L at room temperature and at least one inorganic compound reacting as an acid.

19 Claims, No Drawings

DUMMY PLATE FOR OFFSET PRINTING

FIELD OF THE INVENTION

The present invention relates to a dummy plate for offset printing comprising essentially a mechanically and/or electrochemically roughened, anodically oxidized and hydrophilized aluminium support and a non light-sensitive, water-soluble layer coated thereon. Furthermore it relates to a method for making the dummy plate.

BACKGROUND OF THE INVENTION

In a printing press several plates are generally tensioned next to each other and one behind the other on an impression cylinder. Dummy plates are offset plates without ink-accepting parts. They are used when the paper web must not be completely printed. A dummy plate is tensioned on the impression cylinder there where no image may be transferred onto the paper. The objective of the dummy plate is to take up the fountain solution applied over the entire cylinder width and to transfer it to the paper web. At the same time the dummy plate may not accept the printing ink in order to avoid a transfer of the latter onto the paper ("toning"). A lot of dummy plates are necessary when separate inks in multicolour offset printing are not used on all of the pages so that the respective inking units may not transfer ink there.

Dummy plates are normally roughened and anodically oxidized aluminium plates. They can optionally have an extra hydrophilizing layer. The disadvantage of these dummy plates is that they are very sensitive to fingerprints and to other external influences. Fingerprints for example lead to ink acceptance and consequently to toning in the printing press. Furthermore it has been established that the hydrophilic characteristics of such dummy plates deteriorate upon ageing as a result of which they accept ink in the printing press and tone. This phenomenon is strongly present when the dummy plates were exposed without any protection to the ambient air for a prolonged period of time, which allowed them to take up e.g. moisture, dust or traces of oil. In order to eliminate the consequences of fingerprints and to restore the hydrophilic characteristics of the aluminium surface to the original value, dummy plates are subjected to the normal development process with subsequent gumming. Through development the printing-plate surface is cleaned and hydrophilized. A subsequent gumming preserves the surface. The tendency towards toning in the printing press is considerably less for dummy plates having received such a treatment.

SUMMARY OF THE INVENTION

Therefore it is an object of the present invention to develop a dummy plate lacking the aforementioned disadvantages, especially the sensitivity to fingerprints and ageing. It must be ready for direct use in the printing press, even when it has not undergone a previous development process. Furthermore it must be processable without disturbance in an automatic processor with a negative developer and subsequent gumming. This extra requirement stems from the fact that in automatic plate processors all plates, including the dummy plates, are subjected to the normal development conditions.

The objective can be reached by providing a dummy plate for offset printing comprising essentially a mechanically and/or electrochemically roughened, anodically oxidized and hydrophilized aluminium support in the form of a plate, sheet or band and a non light-sensitive, water-soluble layer coated thereon. The layer is characterized in that it contains at least one organic polymer with a water-solubility of at least 2 g/L at room temperature and at least one inorganic compound reacting as an acid. Preferably the layer contains also a surfactant. Furthermore the layer can also contain a dye.

DETAILED DESCRIPTION OF THE INVENTION

DE-A 39 03 001, 40 30 056 and 38 25 836 disclose non light-sensitive layers of this kind as top layers on photopolymeric layers. In these patents their objective is to prevent the access of oxygen during the photopolymerisation. Contrary thereto the layer in the dummy plate according to the present invention is a protective layer against fingerprints, dust and other influences. Furthermore it is meant to keep the surface of the support hydrophilic even for a prolonged period of time. During development, it was found that not every water-soluble oxygen barrier layer is suitable therefore. Only the combination of water-soluble, organic polymer and inorganic compound reacting as an acid guarantees that the dummy plate can be used in the press without toning even after a prolonged storage period (2 to 3 years).

Suitable water-soluble, organic polymers are disclosed in e.g. U.S. Pat. No. 3, 458, 311. Preferred are polyvinyl alcohol and partially saponified polyvinyl acetates optionally containing vinyl ether and vinyl acetal units. Specially preferred are polyvinyl alcohols still containing residual acetate groups. In case the dummy plates pass through a processing unit with negative developer, polyvinyl alcohols with a content of residual acetyl groups of at least 12 mole % are preferably used. The water-soluble, organic polymers have at room temperature a water-solubility of at least 2 g/L. The content of the water-soluble polymer generally ranges from 60 to 99.5% by weight, preferably 70 to 95% by weight, with respect to the total weight of the layer.

The inorganic compound reacting as an acid keeps the support hydrophilic for a long period of time when it is used in the aforementioned combination with the organic polymer. Suitable compounds are disclosed in DE-A 39 03 001 and 40 30 056. They include especially mineral acids such as phosphoric acids and sulphuric acids as well as water-soluble acid salts thereof such as phosphates. Preferred salts are ammonium phosphates and alkaline or alkaline-earth phosphates. Especially preferred are phosphoric acid, alkaline and ammonium dihydrogen phosphate. The content of the inorganic compound reacting as an acid ranges generally from 0.5 to 40% by weight, preferably 5 to 35% by weight, with respect to the total weight of the layer.

The optionally present surfactant is used to reduce the surface tension of the coating composition and subsequently to enhance the wettability of the support. Preferred surfactants are anionic surfactants such as sodium dodecyl sulphate, sodium dodecyl sulphonate, alkylamino carboxylates and dicarboxylates; cationic surfactants such as tetraalkyl ammonium salts; and non ionic surfactants such as polyethylene glycols having an average molecular weight up to 400.

The content of surfactant(s) ranges up to 10% by weight, preferably 2 to 7% by weight, with respect to the total weight of the layer. Finally, the layer can contain a dye for the visual control of the homogeneity.

In the making of the dummy plates according to the invention, a diluted aqueous solution containing the aforementioned ingredients is generally coated onto the roughened and hydrophilized aluminium support. The content of non volatile ingredients in this solution ranges advantageously from approximately 0.1 to 10% by weight with respect to the total weight of the solution. After drying the water-soluble layer generally has a weight ranging from 0.1 to 3 g/m$^2$, preferably from 0.1 to 1 g/m$^2$.

The plates, sheets or bands out of which the dummy plates according to the invention are made, are composed of aluminium or one of its alloys. They are roughened mechanically and/or electrochemically. Preferably the roughening is carried out electrochemically in diluted hydrochloric acid. During the subsequent anodic oxidation, preferably in diluted sulphuric acid, an oxide layer is formed on the aluminium. Generally the oxidation is controlled in such a way that the oxide layer has a weight of 1 to 5 g/m$^2$.

The thus prepared aluminium material is then hydrophilized. Phosphor-containing compounds are preferably used for the hydrophilization. Especially preferred are organic polymers with phosphor-containing groups, especially phosphinic acid or phosphonic acid groups. Polymers of this kind are disclosed in e.g. EP-A 0 069 318 and 0 069 320. Especially preferred is polyvinyl phosphonic acid. The hydrophilizing agent is generally applied in the form of an aqueous solution and then dried.

It is not necessary to subject the dummy plate according to the invention to the development process, even not after a prolonged storage period. It can be tensioned on the impression cylinder of the press directly after bevelling. The water-soluble layer is stripped off by the fountain solution, setting free the hydrophilic surface of the support.

When applying the hydrophilic protective layer coating faults can occur which cause an undesired toning during printing. Such faults are avoided with the method according to the invention. This method is characterized in that the aqueous coating solution is applied several times, preferably twice, onto the roughened and hydrophilized aluminium support, and dried each time. Coating faults that occurred during the previous application can thereby be compensated. Uncoated areas leading to toning afterwards are surely avoided by this method.

The dummy plates according to the invention can be cut more easily to the desired formats than the uncoated dummy plates. The cutting tools show considerably less wear. This is attributed to the lubricating effect of the coating during cutting.

EXAMPLES

An aluminium band roughened and anodized electrochemically in hydrochloric acid (weight of the oxide layer: 3 g/m$^2$) and hydrophilized with a 0.2 wt % polyvinyl phosphonic acid solution in water was coated as follows:

Example 1

A coating solution disclosed in DE-A 39 03 001, example 1, and in DE-A 40 30 056 having the following composition

| 1.5 wt % | polyvinyl alcohol having a hydrolysis degree of 75–79 mole % and a polymerisation degree P$_n$ = 300, |
| 0.1 wt % | sodium dodecyl sulphate, |
| 0.25 wt % | phosphoric acid (85 wt %) and |
| 98.15 wt % | demineralized water | was coated and dried. The dried layer had a weight of 0.5 g/m$^2$.

Example 2

A coating solution prepared according to DE-A 40 30 056 having the following composition

| 1.5 wt % | polyvinyl alcohol having a hydrolysis degree of 75–79 mole % and a polymerisation degree P$_n$ = 300, |
| 0.1 wt % | sodium dodecyl sulphate, |
| 0.24 wt % | ammonium dihydrogen phosphate (NH$_4$H$_2$PO$_4$) and |
| 98.16 wt % | demineralized water | was coated and dried. The dried layer had a weight of 0.5 g/m$^2$.

Comparative example

A coating solution prepared according to DE-A 38 25 836 having the following composition

| 6.98 wt % | polyvinyl alcohol (K-value 4, 12 mole % of residual acetyl groups), |
| 0.40 wt % | polyethylenimine ($^{(R)}$ Polymin P from BASF AG) and |
| 92.62 wt % | demineralized water | was coated and dried. The dried layer had a weight of 2 g/m$^2$.

Subsequently the plates were proof printed in a Roland-Favorit II press with Dahlgreen fountain solution. The uncoated plate was also included in the test for comparison purposes. The test probes together with the uncoated support were exposed to the ambient air for different time lapses during a prolonged period without packaging and without interleaves. Moisture, dust and oil traces from the air could directly affect the plate surface. Additionally fingerprints were applied on the plates before proof printing in the press. Subsequently the plates were proof printed without any further pretreatment (development). The results are summarized in table 1 at the end of the description.

Furthermore the dummy plate should be processable without any disturbance in a processing unit with negative developer and subsequent gumming. Given the fact that dummy plates also pass through the development process in automatic printing-plate processing units, the plates coated with the respective layers and the uncoated plate were processed in a processor filled with a negative developer having the following composition

| 3.0 parts by weight | sodium dodecyl sulphate |
| 5.4 parts by weight | potassium pelargonate |
| 4.0 parts by weight | 2-phenoxy-ethanol |
| 2.0 parts by weight | potassium tetraborate and |
| 85.6 parts by weight | demineralized water | and gummed with gum arabic.

The plates prepared according to examples 1 and 2 (of the invention) and the uncoated plates could be processed without any problem in said processor; the plate coated according to the comparative example gave rise to problems in the processor in that a greasy residue deposited on the plate, the rollers of the processor and in the developer. Consequently the plate could not be processed any further, i.e. it was impossible to make prints with it. The plates that had passed through the processor without any problems could be printed in the press without toning.

TABLE 1

|  | Storage time | Example 1 | Example 2 | without coating | comparative example |
|---|---|---|---|---|---|
| proof print | fresh probe | no toning OK | no toning OK | no toning OK | no toning OK |
| fingerprints | fresh probe | not visible | not visible | visible | not visible |
| proof print | 1 week | no toning OK | no toning OK | sporadically colour-containing spots | no toning OK |
| fingerprints | 1 week | not visible | not visible | visible | not visible |
| proof print | 2 weeks | no toning OK | no toning OK | colour-containing spots | sporadically colour-containing spots |
| fingerprints | 2 weeks | not visible | not visible | visible | not visible |

We claim:

1. Dummy plate for offset printing consisting essentially of a mechanically and/or electrochemically roughened, anodically oxidized and hydrophilized aluminum support in the form of a plate, sheet or band and a non light-sensitive, water-soluble layer coated thereon, wherein the layer contains at least one water-soluble organic polymer with a water-solubility of at least 2 g/L at room temperature and at least one inorganic compound reacting as an acid, wherein the content of the water-soluble organic polymer ranges from 60 to 99.5% by weight with respect to the total weight of the layer, and wherein the content of the inorganic compound reacting as an acid ranges from 0.5 to 40% by weight with respect to the total weight of the layer.

2. Dummy plate according to claim 1, wherein the aluminum support comprises an oxide layer formed by anodic oxidation having a weight of from 1 to 5 g/m$^2$.

3. Dummy plate according to claim 1, wherein a hydrophilizing agent is employed for hydrophilizing the support and comprises an organic polymer with phosphor-containing groups.

4. Dummy plate according to claim 3, wherein the hydrophilizing agent for hydrophilizing the support is polyvinyl phosphonic acid.

5. Dummy plate according to claim 3, wherein the hydrophilizing agent comprises an organic polymer with phosphinic acid or phosphonic acid groups.

6. Dummy plate according to claim 1, wherein the water-soluble organic polymer is a polyvinyl alcohol having residual acetyl groups and/or polyvinylpyrrolidone.

7. Dummy plate according to claim 1, wherein the inorganic compound reacting as an acid is a mineral acid or a salt thereof reacting as an acid.

8. Dummy plate according to claim 1, wherein the layer contains a surfactant.

9. Dummy plate according to claim 8, wherein the layer comprises 2 to 10% by weight of the surfactant, based on the total weight of the layer.

10. Dummy plate according to claim 1, wherein the weight of the water-soluble layer when dried on the support is in the range of 0.1 to 3 g/m$^2$.

11. Dummy plate according to claim 1, wherein the water-soluble organic polymer comprises a polyvinyl alcohol having residual acetyl groups of more than 12 mol %.

12. Dummy plate according to claim 1, wherein the inorganic substance reacting as an acid comprises phosphoric or sulphuric acid.

13. Dummy plate according to claim 1, wherein the inorganic substance reacting as an acid comprises ammonium dihydrogen phosphate.

14. Dummy plate according to claim 1, wherein the water-soluble organic polymer comprises a polyvinyl alcohol or partially saponified polyvinyl acetate.

15. Dummy plate according to claim 1, wherein the layer comprises a dye.

16. A method for making the dummy plate of claim 1, comprising applying a coating solution containing constituents that form the non light sensitive, water-soluble layer several times to the support, and drying the coating solution after each application.

17. Method according to claim 16, wherein the coating solution is applied two times.

18. A method according to claim 16, wherein the coating solution is an aqueous coating solution.

19. A dummy plate for offset printing comprising a mechanically and/or electrochemically roughened, anodically oxidized and hydrophilized aluminum support in the form of a plate, sheet or band and a non light-sensitive, water-soluble layer directly thereon, wherein the layer contains at least one water-soluble organic polymer with a water-solubility of at least 2 g/L at room temperature and at least one inorganic compound reacting as an acid, wherein the content of the water-soluble organic polymer ranges from 60 to 99.5% by weight with respect to the total weight of the layer, and wherein the content of the inorganic compound reacting as an acid ranges from 0.5 to 40% by weight with respect to the total weight of the layer.

* * * * *